(12) United States Patent
Paniccia et al.

(10) Patent No.: US 6,175,160 B1
(45) Date of Patent: Jan. 16, 2001

(54) FLIP-CHIP HAVING AN ON-CHIP CACHE MEMORY

(75) Inventors: Mario Paniccia, Santa Clara, CA (US); Edward Burton, Hillsboro, OR (US)

(73) Assignee: Intel Corporation, Santa Clara, CA (US)

(*) Notice: Under 35 U.S.C. 154(b), the term of this patent shall be extended for 0 days.

(21) Appl. No.: 09/227,983

(22) Filed: Jan. 8, 1999

(51) Int. Cl.⁷ .................................................. H01L 23/48
(52) U.S. Cl. .................... 257/778; 257/777; 257/778; 257/779; 257/780; 257/781
(58) Field of Search .................................. 257/777, 778, 257/779, 780, 781

(56) References Cited

U.S. PATENT DOCUMENTS

| | | | |
|---|---|---|---|
| 5,814,891 | * | 9/1998 | Hirano ................................. 257/778 |
| 5,883,430 | * | 3/1999 | Johnson ............................... 257/706 |
| 5,952,726 | * | 9/1999 | Liang .................................. 257/778 |
| 5,952,727 | * | 9/1999 | Takano et al. ....................... 257/784 |
| 5,956,605 | * | 9/1999 | Akram et al. ........................ 438/613 |
| 5,973,403 | * | 10/1999 | Wark .................................. 257/777 |
| 5,990,545 | * | 11/1999 | Schueller et al. .................... 257/697 |
| 6,013,944 | * | 1/2000 | Moriya et al. ........................ 257/668 |
| 6,018,196 | * | 1/2000 | Noddin ............................... 257/777 |
| 6,025,650 | * | 2/2000 | Tsuji et al. .......................... 257/786 |
| 6,031,284 | * | 2/2000 | Song .................................. 257/701 |
| 6,043,429 | * | 3/2000 | Blish, II et al. ..................... 174/35 |

FOREIGN PATENT DOCUMENTS

| | | | |
|---|---|---|---|
| 403255657 | * | 11/1991 | (JP) ................................. 257/778 |
| 406061368 | * | 11/1991 | (JP) ................................. 257/778 |
| 404085961 | * | 3/1992 | (JP) ................................. 257/778 |
| 406061383 | * | 3/1994 | (JP) ................................. 257/778 |
| 7-184178 | | 7/1995 | (JP) . |

* cited by examiner

*Primary Examiner*—Mahshid Saadat
*Assistant Examiner*—Edgardo Ortiz
(74) *Attorney, Agent, or Firm*—Blakely, Sokoloff, Taylor & Zafman LLP

(57) ABSTRACT

A flip-chip with an on-chip cache memory device. The flip-chip includes a semiconductor substrate having first and second opposing surfaces with circuit elements formed within the first surface. A plurality of raised bump contacts are located on the first surface and connected to the circuit elements. Additionally, a plurality of electrical interconnects are located on the second surface and connected to the circuit elements. A cache memory device is electrically coupled to the plurality of electrical interconnects located on the second surface.

18 Claims, 4 Drawing Sheets

FLIP-CHIP HAVING AN ON-CHIP CACHE MEMORY

BACKGROUND OF THE INVENTION

1. Field of the Invention

The present invention relates generally to a semiconductor chip and, more specifically, to a flip-chip having a cache memory device attached to the backside thereof.

2. Discussion of Related Art

Within the integrated circuit industry there is a continuing effort to increase integrated circuit speed as well as device density. As a result of these efforts, there is a trend towards using flip-chip technology when packaging complex high speed integrated circuits. Flip-chip technology is also known as control collapse chip connection (C4) technology. In flip-chip technology, the integrated circuit die is flipped upside down. By flipping the integrated circuit die upside down, ball bonds may be used to provide direct electrical connections from the bond pads of the die directly to a corresponding set of pads on a package.

In the following discussion reference will be made to a number of drawings. The drawings are provided for descriptive purposes only and are not drawn to scale.

In computer systems, the access of main memory to retrieve information often takes a substantial portion of the operational time. This occurs for various reasons. First, main memory is made of random access memory. Such memory is often sufficiently large such that the cost is kept within bounds by using relatively slow memory. Second, main memory is typically accessed over a system bus, which provides a less than optimum interface between the main memory and the central processing unit of the system.

For this reason, the use of cache memories to increase system speed has become prevalent. A cache memory makes use of a relatively small amount of fast random access memory in which recently used instructions and data are stored as they are used by the processor. Such instructions and data are then available in the cache to be more rapidly accessed by the associated processor when next required. The basic theory of caching is that, in general, information which has been recently used is more likely to be used sooner than is other information. The cache memory is often both physically faster than the random access memory used for main memory and arranged so that it may be addressed more rapidly than main memory.

Currently, cache memory for C4 packaged processor chips (flip-chips) is typically located off the chip onto a processor card or motherboard. Locating the cache memory off-chip produces delays caused by interfacing off-chip transfers. Cache memory may also be located on the processed die. The size of this type cache memory, however, is constrained by the combination of both economic and processing factors which limit how large an on-die cache can be. Thus, although the goal is always to put as much cache memory on the die as possible, it is still desirable to have as small a die as possible.

SUMMARY OF THE INVENTION

An integrated circuit device is disclosed. The integrated circuit device includes a semiconductor substrate having first and second opposing surfaces with circuit elements formed within the first surface. A plurality of raised bump contacts are located on the first surface and connected to the circuit elements. Additionally, a plurality of electrical interconnects are located on the second surface and connected to the circuit elements. A cache memory device is electrically coupled to the plurality of electrical interconnects located on the second surface.

BRIEF DESCRIPTION OF THE DRAWINGS

The invention is further described by way of example with reference to the accompanying drawings wherein.

DETAILED DESCRIPTION OF THE INVENTION

A C4 packaged chip (flip-chip) having a cache memory device electrically coupled to the backside of the chip is described. In the following description, numerous specific details are set forth such as material types, processes, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 1:
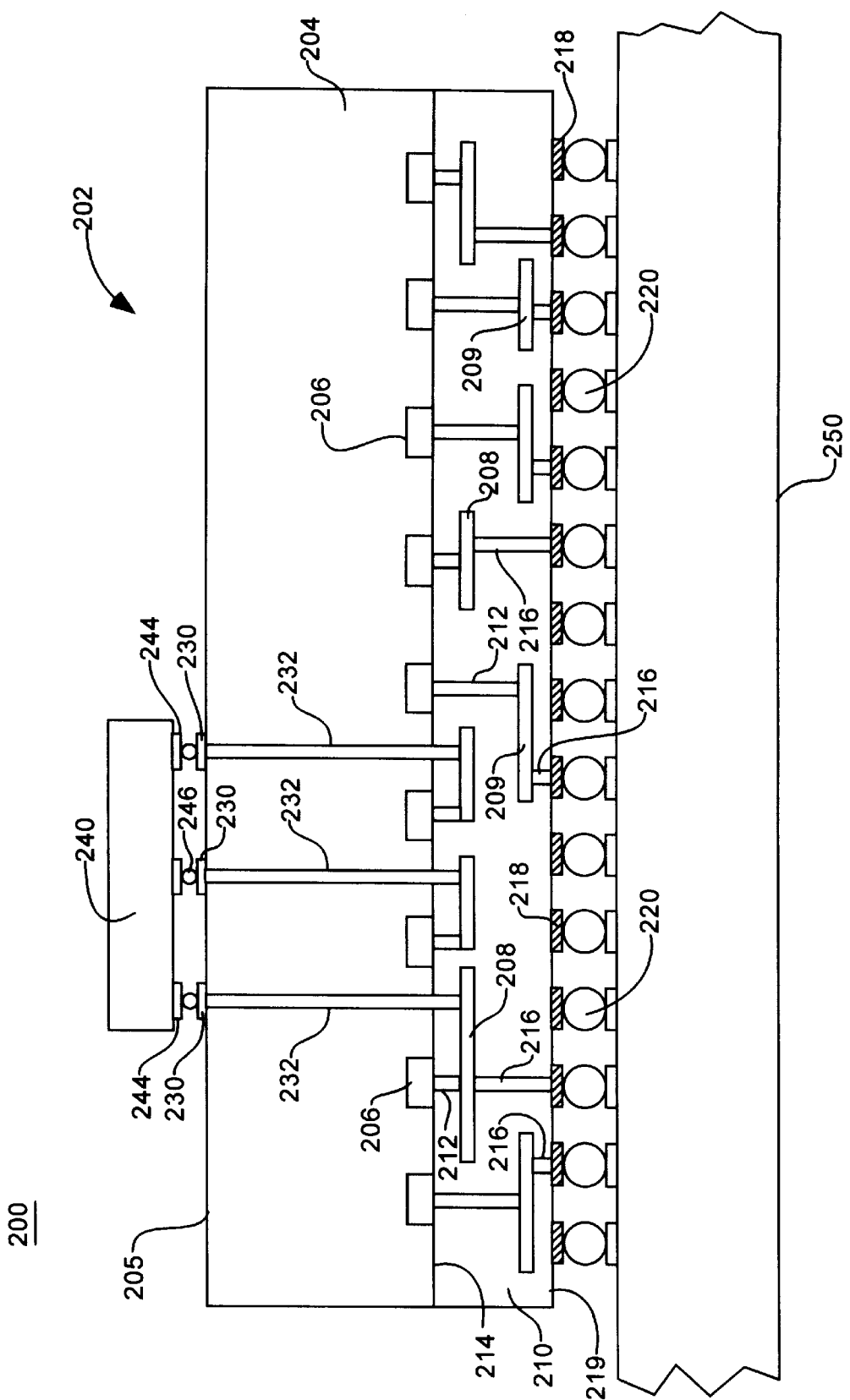
FIG. 1 is a sectioned side view of a flip-chip with a cache memory device electrically coupled to the backside of the chip.

FIG. 1 illustrates a side view of a chip package 200 in one embodiment of the present invention. Package 200 includes a semiconductor chip 202 that is electrically coupled to a package substrate 250 via a plurality of raised bump/solder bump connections 220. Chip 202 includes a semiconductor substrate 204 having a plurality of circuit elements 206 formed within the frontside surface 214 of the semiconductor substrate 204. A conductive region 210 is located above the frontside surface 214 of semiconductor substrate 204. Conductive region 210 generally includes multiple layers of conductive lines 208 and 209 that are electrically coupled to the circuit elements 206 by conductive vias 212. The conductive lines 208 and 209 may be any one of several conductive materials such as tungsten, titanium, aluminum, copper, doped silicon, doped polysilicon, or a metal silicide layer. Conductive lines 208 and 209 are typically deposited on and separated by a dielectric layers. Although only two conductive layers are shown in FIG. 1, it is noted that conductive region 210 generally includes additional conductive layers. External connections to the chip 202 are made through a first set of electrical contact pads 218 located on the top-side surface 219 of conductive region 210. Contact pads 218 are electrically coupled to conductive lines 208 and 209 by conductive vias 216.

Additional electrical interconnects/contact pads 230 are provided on the backside surface 205 of the semiconductor substrate 204. Conductive vias 232 electrically couple contact pads 230 to circuit elements 206 through conductive lines 208 and vias 212. The I/O and power connections 244 of a cache memory device 240 are electrically coupled to contact pads 230 by raised bump contacts 246.

The placement of the cache memory device 240 onto the backside surface 205 of chip 202 offers many advantages. By minimizing the physical distance between the cache memory device 240 and chip 202, large external wiring capacitances are eliminated permitting smaller I/O drivers to be used. Smaller drivers occupy less area resulting in reduced die size. Smaller drivers and the elimination of external wiring also results in a lower power consumption, the elimination of the impedance mismatch between the driver and external lines, increased I/O speed and reduced clocking complexity (the use of a common clock rather than a source synchronous scheme). Other problems such as crosstalk and clock phase boundary problems are also eliminated.

With continuing reference to FIG. 1, semiconductor substrate 204 is typically made of silicon. Vias 232 are produced by etching or micromachining the backside 205 of substrate 204 and vapor depositing a conductive material within the via. The conductive material generally includes a conductive metal such as aluminum or copper. Other electrically conductive metals or materials may also be used.

Figure 2:
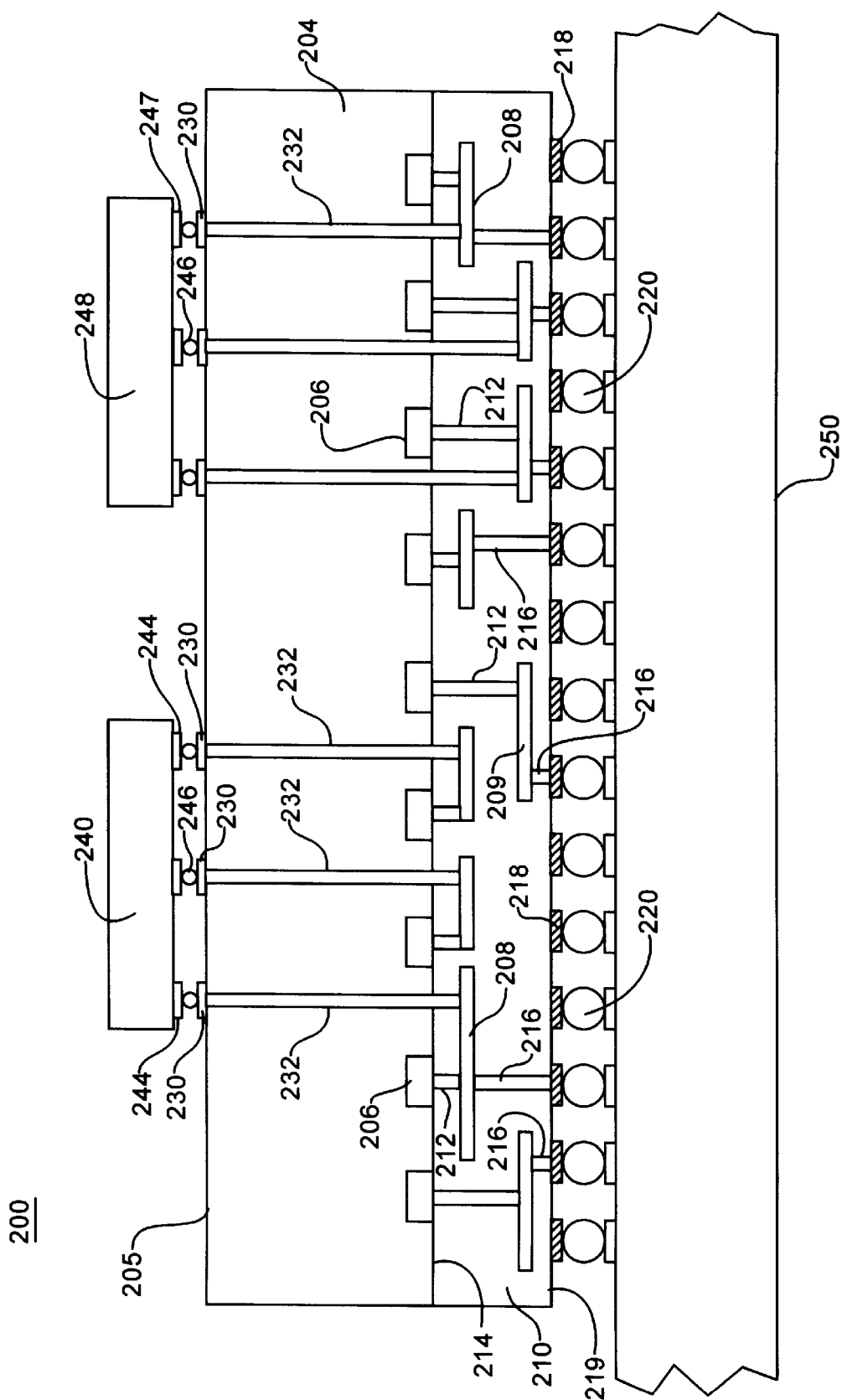
FIG. 2 is a sectioned side view of a flip-chip in another embodiment of the present invention; and, FIG. 3 is a sectioned side view of a flip-chip in another embodiment of the present invention.

An alternative embodiment of the present invention is illustrated in FIG. 2. In FIG. 2, multiple cache memory devices 240 and 248 are shown located on the backside 205 of the chip 202 side-by-side. Both cache memory devices 240 and 248 are electrically coupled to electrical interconnects/contact pads 230 by raised bump contacts 246. Conductive vias 232 electrically couple contact pads 230 to circuit elements 206 through conductive lines 208 and 209 through vias 212.

Figure 3:
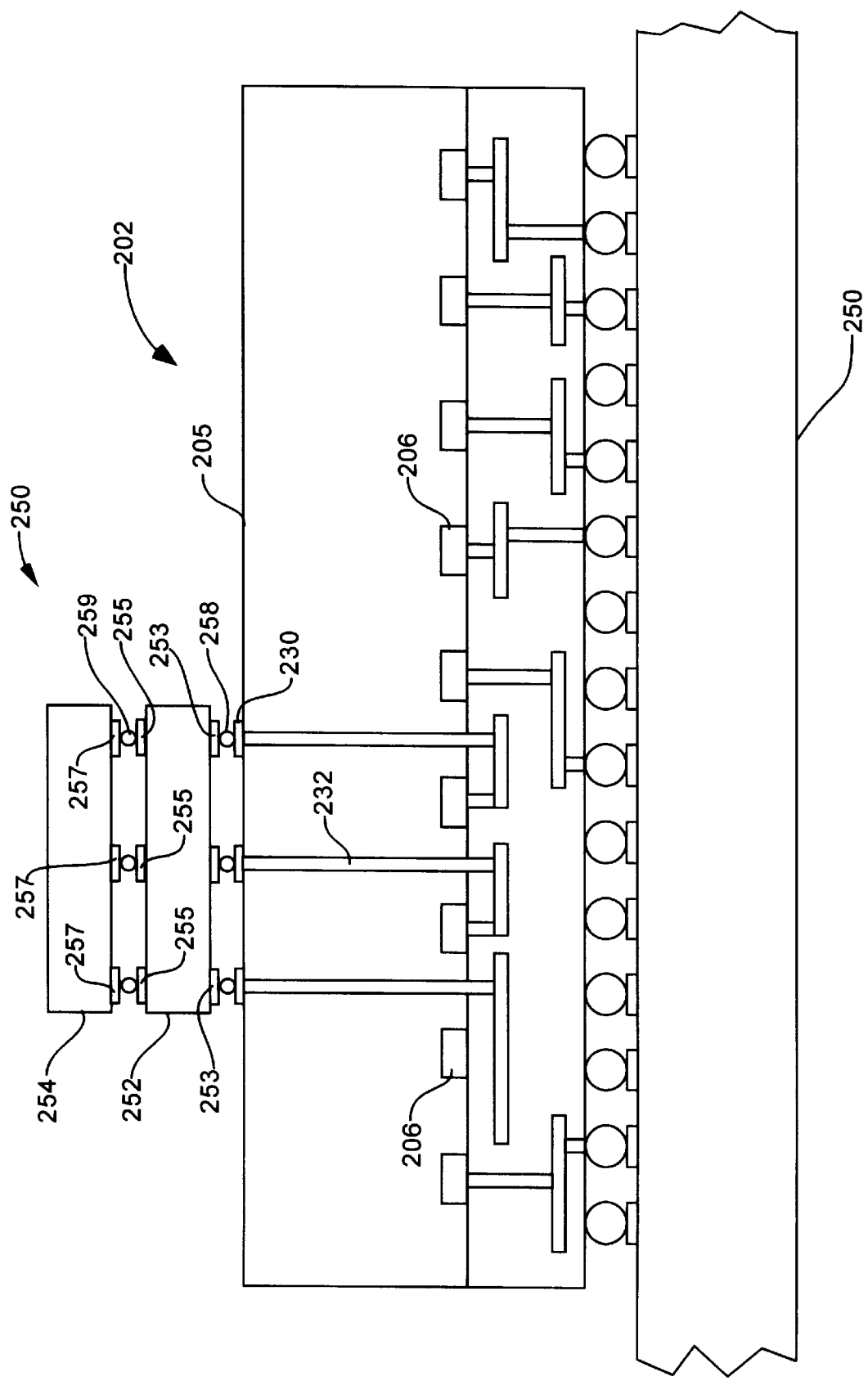

With reference to FIG. 3, a flip-chip 202 having a stacked cache memory 250 located on the backside 205 of the chip is shown. The stacked cache memory 250 includes a first cache memory device 252 and a second cache memory device 254 attached to the backside surface of device 252. Pads 253 located on the frontside of the first cache memory 252 device are electrically coupled to contact pads 230 located on the backside 205 of flip-chip 202. Additional on-chip cache memory is provided by the second cache memory device 254 which is electrically coupled to the circuit elements of flip-chip 202 through the first cache memory device 252. Contact pads 255 and 257 located on cache memory devices 252 and 254, respectively, are electrically coupled by raised bump contacts or ball bonds 259. By stacking the cache memory devices in the manner illustrated in FIG. 2, additional on-chip cache memory is made possible without reducing the area available for attaching a heatsink to the backside 205 of flip-chip 202.

Figure 4:
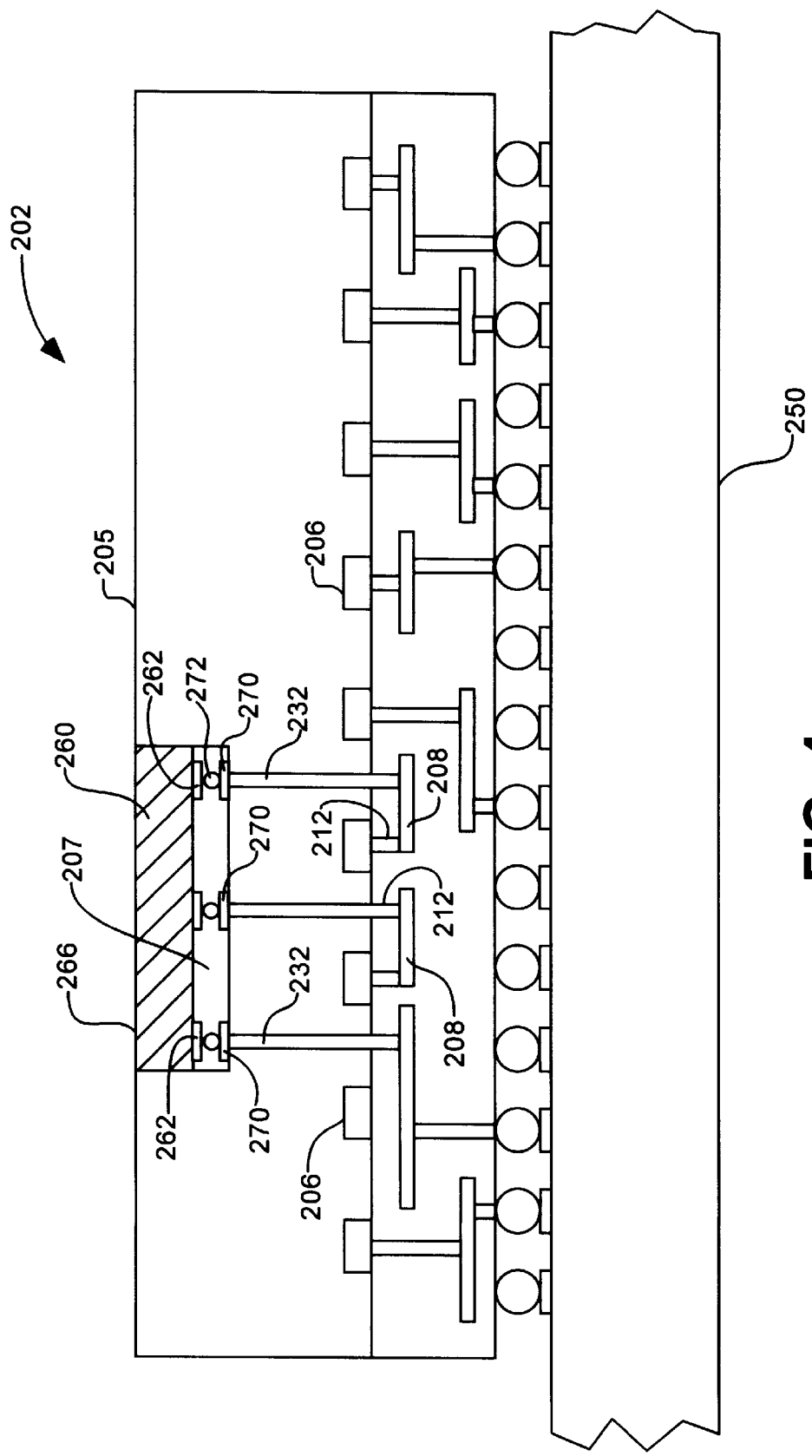
FIG. 4 is a sectioned side view of a flip-chip with a cache memory device located within a recess in the backside of the chip.

In FIG. 4, a cache memory device 260 is located within a recess 207 in the backside of flip-chip 202. Contact pads 270 located within recess 207 are electrically coupled to the flip-chip circuit elements 206 through vias 232, conductive lines 208 and vias 212. The cache memory I/O and power connections 262 are electrically coupled to the flip-chip backside contact pads 270 by ball bonds 272. Ball bonds 272 typically comprise solder bump connections.

The backside surface 266 of cache memory device 260 is flush with the backside surface 205 of flip-chip 202. This configuration maximizes the surface area available for attaching a heatsink or other heat dissipating device to the backside of flip-chip 202.

Note also that a stacked cache memory, such as stacked cache memory 250 shown in FIG. 2, may be located in a recess in the backside of flip-chip 202. This would provide additional on-chip cache memory while still maximizing the surface area available for attaching a heatsink or other heat dissipating device to the backside of flip chip 202. Further, multiple recesses could be formed in the backside of flip-chip 202 for multiple cache memory devices, whether individual devices or stacked devices.

Thus, a flip-chip having an on-chip cache memory device has been described. Although the present invention has been described with reference to specific exemplary embodiments, it will be evident that various modifications and changes may be made to these embodiments without departing from the broader spirit and scope of the invention. Accordingly, the specifications and drawings are to be regarded in an illustrative rather than a restrictive sense.

What is claimed:

1. An integrated circuit device comprising:
   a semiconductor substrate having a first surface and a second surface opposite said first surface;
   circuit elements formed within said first surface;
   a plurality of raised bump contacts disposed on said first surface and connected to said circuit elements;
   a first plurality of electrical interconnects disposed on said second surface connected to said circuit elements; and,
   a first cache memory device electrically coupled to said plurality of electrical interconnects.

2. The integrated circuit device of claim 1 wherein said electrical interconnects comprise raised bump contacts.

3. The integrated circuit device of claim 1 further comprising conductive lines electrically connecting said circuit elements, at least one of said electrical interconnects coupled to at least one of said conductive lines.

4. The integrated circuit device of claim 1 further comprising a first layer of conductive lines and a second layer of conductive lines electrically connecting said circuit elements, said first layer of conductive lines located adjacent said circuit elements, at least one of said first plurality of electrical interconnects coupled to at least one of said first layer conductive lines.

5. The integrated circuit device of claim 1 wherein said second surface is located within a first recess in said semiconductor substrate, each of said first cache memory device and said semiconductor substrate having a backside surface, said backside surfaces being substantially co-planar.

6. The integrated circuit device of claim 1 further comprising a second cache memory device coupled to said plurality of electrical interconnects.

7. The integrated circuit device of claim 1, said first cache memory device having a backside surface, wherein said second cache memory device is coupled to said backside surface of said first cache memory device.

8. An integrated circuit device comprising:
   a semiconductor substrate having a first surface and a second surface opposite said first surface;
   a first recess in said second surface;
   circuit elements formed within said first surface;
   conductive lines electrically connecting said circuit elements;
   a first plurality of bump contacts disposed on said first surface and electrically connected to said circuit elements;
   a first plurality of electrical interconnects disposed in said first recess electrically connected to said circuit elements; and,
   a first cache memory device disposed in said first recess and electrically coupled to said first plurality of electrical interconnects.

9. The integrated circuit device of claim 8 wherein said first plurality of electrical interconnects comprise raised bump contacts.

10. The integrated circuit device of claim 8 wherein each of said first cache memory device and said semiconductor substrate have a backside surface, said backside surfaces being substantially co-planar.

11. The integrated circuit device of claim 8 further comprising a second cache memory device coupled to said plurality of electrical interconnects.

12. The integrated circuit device of claim 11, said first cache memory device having a backside surface, wherein said second cache memory device is coupled to said backside surface of said first cache memory device.

13. The integrated circuit device of claim 11 further comprising a second recess in said second surface with said second cache memory device disposed in said second recess and electrically coupled to said first plurality of electrical interconnects.

14. The integrated circuit device of claim 7, wherein said second surface is located within a first recess within said semiconductor substrate, each of said second cache memory device and said semiconductor substrate having a backside surface, said backside surfaces being substantially co-planar.

15. The integrated circuit device of claim 12, wherein said second surface is located within a first recess within said semiconductor substrate, each of said second cache memory device and said semiconductor substrate having a backside surface being substantially co-planar.

16. The integrated circuit device of claim 13 wherein each of said second cache memory device and said semiconductor substrate have a backside surface, said backside surface being substantially co-planar.

17. The integrated circuit device of claim 12, further comprising a third cache memory device coupled to said plurality of electrical interconnects.

18. The integrated circuit device of claim 17 further comprising a second recess in said second surface with said third cache memory device disposed in said second recess and electrically coupled to said first plurality of electrical interconnects.

* * * * *